United States Patent
Kim et al.

(10) Patent No.: US 11,576,254 B2
(45) Date of Patent: Feb. 7, 2023

(54) CABLE SUBSTRATE

(71) Applicant: SAMSUNG ELECTRO-MECHANICS CO., LTD., Suwon-si (KR)

(72) Inventors: Jung Soo Kim, Suwon-si (KR); Dae Jung Byun, Suwon-si (KR); Sang Hyun Sim, Suwon-si (KR); Chang Min Ha, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 99 days.

(21) Appl. No.: 17/199,131

(22) Filed: Mar. 11, 2021

(65) Prior Publication Data

US 2022/0174812 A1    Jun. 2, 2022

(30) Foreign Application Priority Data

Dec. 1, 2020    (KR) .......................... 10-2020-0165927

(51) Int. Cl.
*H05K 1/02* (2006.01)

(52) U.S. Cl.
CPC ..... *H05K 1/028* (2013.01); *H05K 2201/0141* (2013.01); *H05K 2201/0154* (2013.01); *H05K 2201/052* (2013.01); *H05K 2201/09163* (2013.01)

(58) Field of Classification Search
CPC ..... H05K 1/0277; H05K 1/0278; H05K 1/028
See application file for complete search history.

(56) References Cited

U.S. PATENT DOCUMENTS

| 2002/0113246 A1* | 8/2002 | Nagai | H01R 12/7076 438/22 |
|---|---|---|---|
| 2006/0042816 A1 | 3/2006 | Sakurai et al. | |

FOREIGN PATENT DOCUMENTS

| JP | 2003-508929 A | 3/2003 | |
| JP | 2008-117884 A | 5/2008 | |
| JP | 4519582 B2 | 8/2010 | |
| JP | 2016134476 A * | 7/2016 | ............... H05K 1/02 |
| WO | 01/17321 A1 | 3/2001 | |

OTHER PUBLICATIONS

Ishiguro et al. Machine translation of JP 2016134476 A Jul. 2016 (Year: 2016).*

* cited by examiner

*Primary Examiner* — Jeremy C Norris
(74) *Attorney, Agent, or Firm* — Morgan, Lewis & Bockius LLP

(57) ABSTRACT

A cable substrate includes an insulating layer, a slit portion penetrating through at least a portion of the insulating layer in a thickness direction of the insulating layer, and a dummy pattern disposed on the insulating layer. At least a portion of the dummy pattern is exposed to the slit portion.

22 Claims, 5 Drawing Sheets

I-I'

CABLE SUBSTRATE

CROSS-REFERENCE TO RELATED APPLICATION

This application claims the benefit under 35 USC 119 (a) of Korean Patent Application No. 10-2020-0165927 filed on Dec. 1, 2020 in the Korean Intellectual Property Office, the entire disclosure of which is incorporated herein by reference for all purposes.

TECHNICAL FIELD

The present disclosure relates to a cable substrate, and more particularly, to a cable substrate capable of multiple connections.

BACKGROUND

Most cable substrates have a structure connecting a main board or modem to an antenna, one-to-one in one direction. Accordingly, there is a need for a cable substrate capable of multiple connections, and when a multiple connection structure is used, a signal transmission path and a degree of freedom in design may be secured, and utilization in a flexible substrate may also be improved. On the other hand, in the case of a multi-connection cable substrate, defects such as tearing of materials in the branching region in which the substrate is separated may be problematic.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

Exemplary embodiments provide a cable substrate capable of multiple connections.

Exemplary embodiments provide a cable substrate in which damage to the substrate in a separation area may be prevented.

According to an aspect of the present disclosure, a cable substrate includes an insulating layer, a slit portion penetrating through at least a portion of the insulating layer in a thickness direction, and a dummy pattern disposed on the insulating layer. At least a portion of the dummy pattern is exposed to the slit portion, According to an aspect of the present disclosure, a cable substrate includes a plurality of insulating layers, a slit portion penetrating through the plurality of insulating layers and extending in one direction, and a dummy pattern disposed on at least one of the plurality of insulating layers and at least partially exposed to an inner wall of the slit portion.

According to an aspect of the present disclosure, a cable substrate includes one or more insulating layers, and one or more conducive layers disposed on the one or more insulating layers, and including first to fourth patterns respectively disposed in first to fourth portions of the cable substrate. The one or more insulating layers extends across the first to fourth portions of the cable substrate. The first portion and the second portion each extend from one side of the third portion and are separated from each other by a slit portion of the cable substrate. The fourth portion extends from another side of the third portion. The third pattern in the third portion is exposed to the slit portion.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
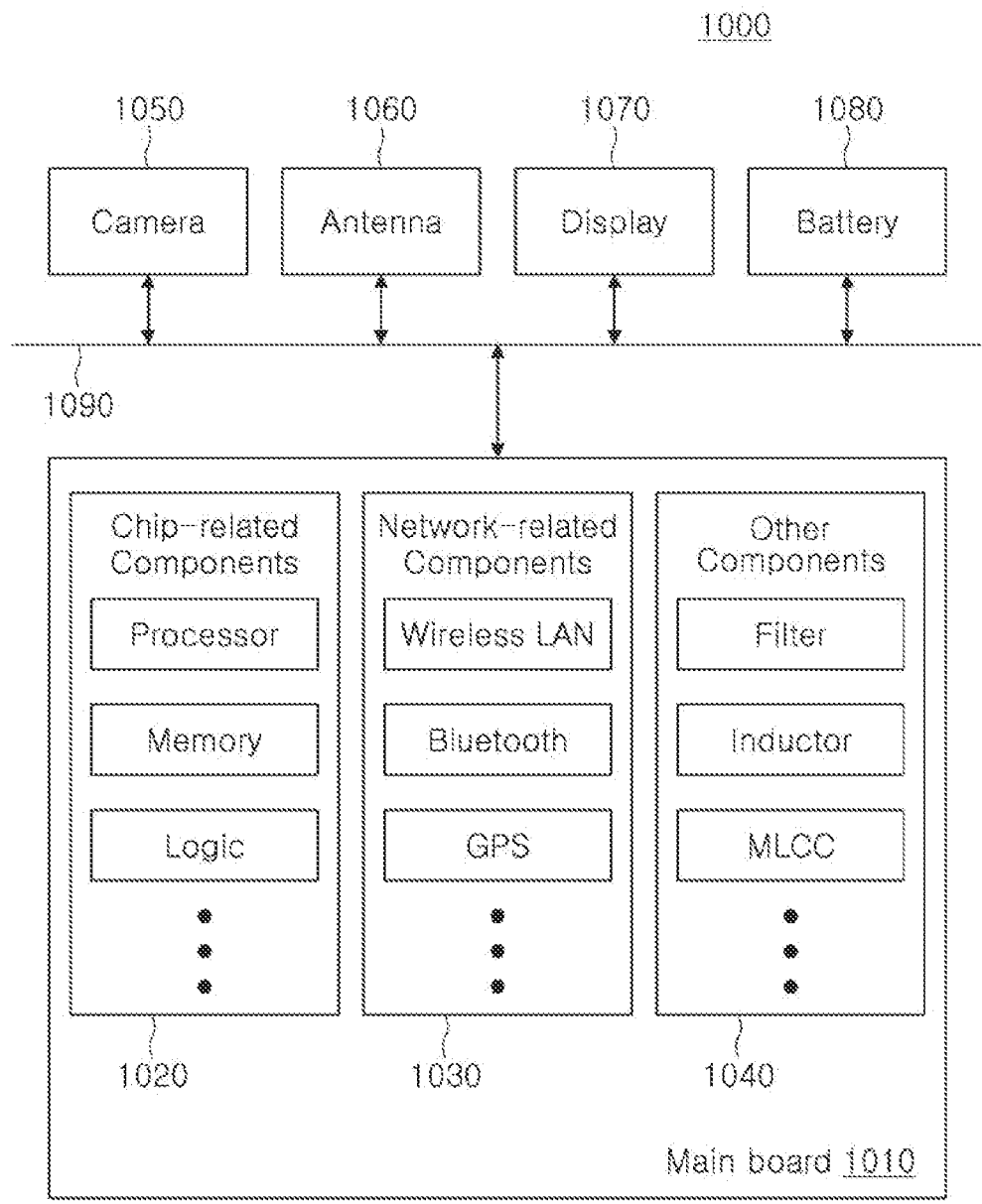
FIG. 1 is a block diagram schematically illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is to be noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape occurring during manufacturing.

The features of the examples described herein may be combined in various manners as will be apparent after gaining an understanding of the disclosure of this application. Further, although the examples described herein have a variety of configurations, other configurations are possible as will be apparent after gaining an understanding of the disclosure of this application.

The drawings may not be to scale, and the relative sizes, proportions, and depictions of elements in the drawings may be exaggerated for clarity, illustration, and convenience.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components in addition to the above-described chip-related components. In addition, the chip related components 1020 may be combined with each other. The chip related components 1020 may be in the form of a package including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include any of a variety of other wireless or wired standards or protocols. In addition, the network related components 1030 may be combined with the chip related components 1020 and be provided in the form of a package.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components in the form of a chip, used for various other purposes, or the like. In addition, other components 1040 may be combined with the chip related components 1020 and/or the network related components 1030 and provided in the form of a package.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, and the like, but are not limited thereto. For example, these other electronic components may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, and the like. In addition, these other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
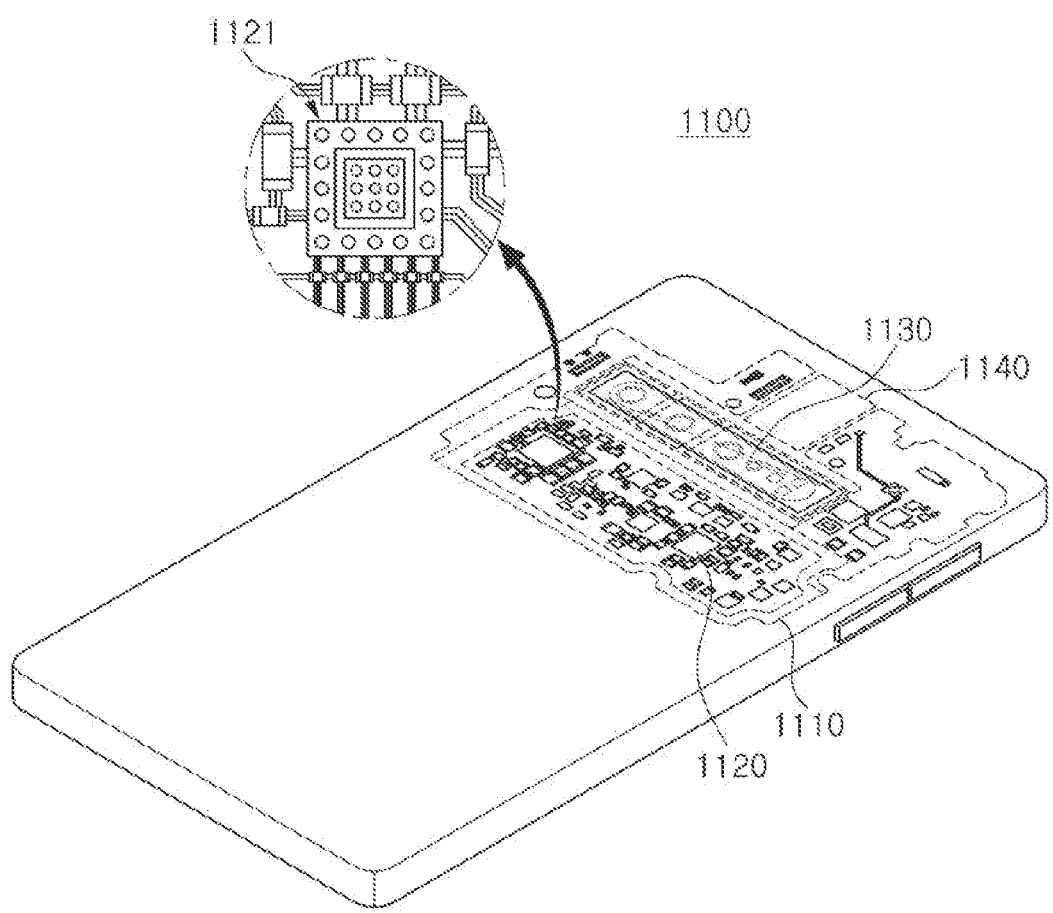
FIG. 2 is a perspective view schematically illustrating an example of an electronic device.

FIG. 2 is a schematic perspective view illustrating an example of an electronic device.

Referring to FIG. 2, the electronic device may be, for example, a smartphone 1100. A motherboard 1110 is accommodated in the smartphone 1100, and various electronic components 1120 are physically and/or electrically connected to the motherboard 1110. In addition, a camera module 1130 and/or a speaker 1140 are accommodated in the smartphone. Some of the electronic components 1120 may be the above-described chip-related parts, for example, a cable substrate 1121, but the present inventive concept is not limited thereto. The cable substrate 1121 may have a form in which an electronic component is embedded in a multilayer printed circuit board, but is not limited thereto. On the other hand, the electronic device is not necessarily limited to the smartphone 1100, and may be other electronic devices as described above.

Figure 3:
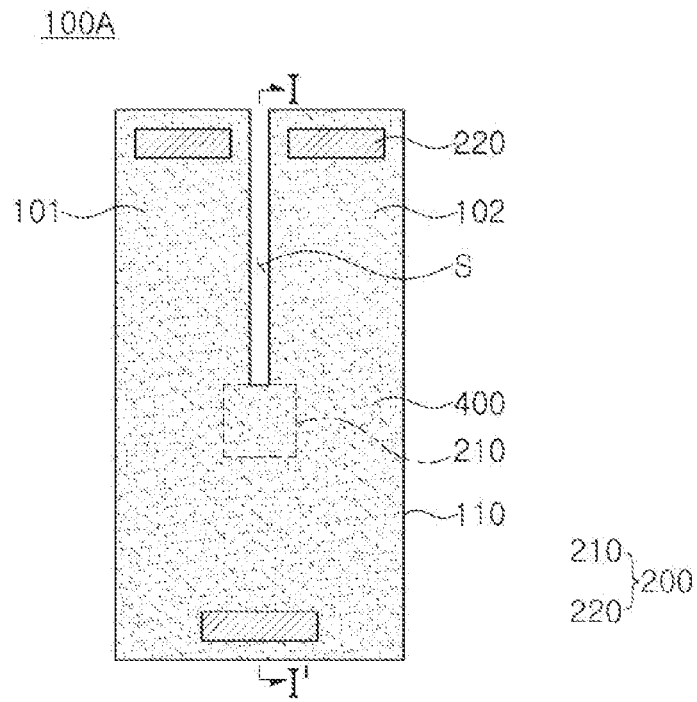
FIGS. 3 and 4 are top perspective views schematically illustrating a partial region of a cable substrate according to an example.
Figure 4:
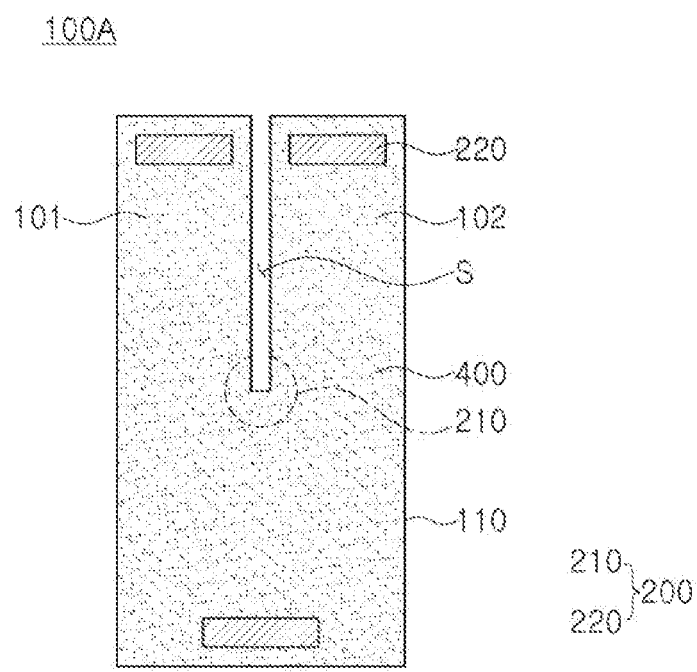
Figure 5:
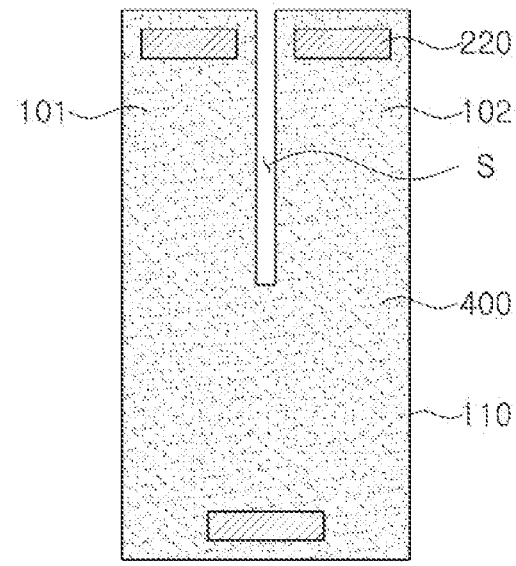
FIG. 5 is a top view schematically illustrating an example of a cable substrate.

FIGS. 3 and 4 are perspective plan views schematically illustrating an example of a partial area of a cable substrate, and FIG. 5 is a top view schematically illustrating an example of a cable substrate.

Referring to FIGS. 3 and 4, a cable substrate 100A according to an example includes an insulating layer 110, a slit portion S formed in the insulating layer 110, a circuit pattern 200 disposed on the insulating layer 110, and a protective layer 400 disposed on the insulating layer 110 to expose at least a portion of the circuit pattern 200.

For example, the cable substrate 100A according to an example may be divided into first and second connection portions 101 and 102 with the slit portion S interposed therebetween, by processing the slit portion S after patterning the outer circuit pattern 200 and disposing the protective layer 400, as in a process to be described later. In this case, the first and second connection portions 101 and 102 may be connected to different external substrates or components, respectively, and thus, multiple connections of a larger number of components than the one-to-one method are possible.

On the other hand, the insulating layer 110 of the cable substrate 100A according to an example may include a flexible material. Accordingly, the first and second connection portions 101 and 102 may be bent to face in different directions, respectively, and may be connected to components disposed in different positions. In this case, the degree of design freedom of a final structure may be secured, and the design may be various.

On the other hand, the cable substrate 100A according to an example includes a dummy pattern 210 disposed on the insulating layer 110. The dummy pattern 210 may be disposed in a position in which the first and second connection portions 101 and 102 start to be separated, for example, at a branching point of the first and second connection portions 101 and 102, on the insulating layer 110 and, accordingly, may be disposed to be adjacent to the slit portion S. Due to the arrangement of the dummy pattern 210, when processing the slit portion S during a manufacturing process to be described later, the dummy pattern may function as a stopper so that the slit portion S is not processed more than necessary.

In addition, when the insulating layer 110 includes a material having flexibility, the first and second connection portions 101 and 102 having flexibility may be bent indifferent directions, respectively. In this case, since the dummy pattern 210 is disposed at the branching point of the first and second connection portions 101 and 102, occurrence of defects such as tearing of the cable substrate 100A may be prevented in advance.

Hereinafter, components of the cable substrate 100A according to an example will be described in more detail with reference to the drawings.

The insulating layer 110 functions to support the cable substrate 100A, and the circuit pattern 200 may be disposed thereon. An insulating material may be used as the material of the insulating layer 110, and a thermosetting resin such as an epoxy resin or a thermoplastic resin such as polyimide may be used as the insulating material. For example, a build-up film such as Prepreg or Ajinomoto Build-up Film (ABF), or a photosensitive insulating layer including a photosensitive electrical insulating resin may be used, but the insulating material is not limited thereto.

In addition, the insulating layer 110 may include an insulating material that is flexible and has flexibility. In this case, the insulating layer 110 may include a soft material, for example, include at least one of polyimide, modified polyimide, modified epoxy resin, liquid crystal polymer, polytetrafluoroethylene (PTFE), Polyphenylene Sulfide (PPS), and Polyphenylene Ether (PPE), but the material is not limited thereto. For example, any flexible electrical insulating material may be used as the insulating layer 110 applied to the present embodiment without limitation.

The circuit pattern 200 may include the dummy pattern 210, a signal pattern 220, and a ground pattern 230. The dummy pattern 210, the signal pattern 220, and the ground pattern 230 may be disposed on the insulating layer 110, and the dummy pattern 210 is disconnected from the signal pattern 220, and thus, electrical signals may not pass therethrough. On the other hand, the dummy pattern 210 may be connected to the ground pattern 230 and thus may function as a ground layer such as Electromagnetic Interference (EMI) shielding.

On the other hand, the ground pattern 230 is an optional configuration, and may not be disposed on the insulating layer 110, and accordingly, the dummy pattern 210 may be in a state isolated from the signal pattern 220 without a separate connection, to be spaced apart therefrom.

A metal material may be used as a material of the circuit pattern 200, and as the metal material, copper (Cu), aluminum (Al), silver (Ag), tin (Sn), gold (Au), nickel (Ni), lead (Pb), titanium (Ti), or alloys thereof may be used. As described above, the circuit pattern 200 may perform various functions depending on designs. For example, the circuit pattern 200 may include a ground pattern, a power pattern, a signal pattern, and the like. In addition, in the case of the circuit pattern 200 according to an example of the present disclosure, the dummy pattern 210 may be additionally included. Each of these patterns may have a line, plane, or pad shape. The circuit pattern 200 may be formed by a plating process such as an Additive Process (AP), a Semi-AP (SAP), a Modified SAP (MSAP), or Tenting (TT), and as a result, may include a seed layer as an electroless plating layer, and an electrolytic plating layer formed on the basis of the seed layer. When using Resin Coated Copper (RCC) as the circuit pattern 200, a metal foil such as copper foil may be further included on a lowermost side, and if necessary, a primer resin formed on the surface of the metal foil may be further included.

The dummy pattern 210 is a component included in the circuit pattern 200 as described above, and may be formed simultaneously when the signal pattern 220 or the ground pattern 230 included in the circuit pattern 200 is formed. As a method of forming the dummy pattern 210, a general patterning process may be used, such as AP, SAP, MSAP, TT, and the like described above.

The dummy pattern 210 is disposed in a region separated by the first and second connection portions 101 and 102 on the insulating layer 110 as illustrated by a dotted line in FIG. 3. Accordingly, the dummy pattern 210 may be disposed to be in contact with the end of the slit portion S formed between the first and second connection portions 101 and 102. As can be seen from a cross-sectional view to be described later, the dummy pattern 210 may have a structure in which the dummy pattern 210 is in contact with an end portion S' of the slit portion S, and at least a portion of the dummy pattern is exposed to the inner wall of the slit portion S. The above-described end portion S' of the slit portion may be an end portion in the extending direction of the slit portion S in a process in which the slit portion S is extended and processed. In a process to be described later, after the dummy pattern 210 is disposed, the slit portion S is formed through a process such as laser processing, and at this time, the dummy pattern 210 may function as a stopper layer in the processing operation, and accordingly, the slit portion S extends in one direction, to be formed up to only a region in which the dummy pattern 210 is disposed. Accordingly, at least a portion of the side surface of the dummy pattern 210 may contact the end portion S' of the slit portion and may be exposed to the inner wall of the slit portion S. In detail, at least a portion of the side surface of the dummy pattern 210 may be coplanar with the end portion S' of the slit portion. On the other hand, since the slit portion S is formed by processing the insulating layer 110 and the protective layer 400 to be described later, a region of the dummy pattern 210 exposed to the inside of the slit portion S may also be coplanar with a region in which the insulating layer 110 and the protective layer 400 are exposed to the inside of the slit portion S.

On the other hand, the dummy pattern 210 may perform a function of preventing the occurrence of defects in the cable substrate 100A, in addition to a function of a stopper layer during processing of the slit portion S. In detail, as described above, when the insulating layer 110 includes a flexible material, the cable substrate 100A according to an example of the present disclosure may be flexibly bent. The first and second connection portions 101 and 102 of the cable substrate 100A may be bent in different directions, respectively, and in an area in which the cable substrate 100A is separated into the first and second connection portions 101 and 102, defects such as tearing of the cable substrate 100A may occur. In this case, the dummy pattern 210 disposed in an area in which the cable substrate 100A is separated by the first and second connection portions 101 and 102 may perform the function of preventing the above-described defects. Due to the arrangement of the dummy pattern 210, defects such as tearing and cracking of the insulating layer 110 and the protective layer 400 may be prevented, and further, damage to the signal pattern 220 or the ground pattern 230 disposed on the insulating layer 110 may be prevented.

On the other hand, referring to FIG. 3, the dummy pattern 210 has a quadrangular shape and may be formed to contact the end of the slit portion S, but the shape is not limited, and the side of the dummy pattern 210 is not necessarily exposed only to the end portion S' of the slit portion Sin the extension direction thereof. For example, as illustrated in FIG. 4, the dummy pattern 210 may have various shapes such as a circle without limitation, and may also have a shape surrounding the end of the slit portion S. In this case, the side surface of the dummy pattern 210 is not only exposed to the end portion S' of the slit portion S in the extension direction, but also exposed to other inner walls of the slit portion S adjacent to the end portion S' of the slit portion S in the extension direction. In this case, the side surface of the dummy pattern 210 may also be coplanar with at least a portion of the side surfaces of each of the first and second connection portions 101 and 102.

The signal pattern 220 may be disposed on the insulating layer 110 and may serve to transmit a signal of the cable substrate 100A. In detail, the signal pattern 220 is also disposed in a position adjacent to an end of each of the first and second connection portions 101 and 102, on the insulating layer 110 on the cable substrate 100A, and may also be disposed in a position adjacent to an end opposite to the end of each of the first and second connection portions 101 and 102, to be optimized for the function of the cable substrate 100A connecting different configurations. As described above, the signal pattern 220 may be formed by a process such as AP, SAP, MSAP, TT, or the like. On the other hand, the signal pattern 220 may be disposed at the same level as the dummy pattern 210 functioning as a stopper layer or a layer for preventing defects, but may not be electrically connected to the dummy pattern 210.

The ground pattern 230 may be disposed on the insulating layer 110 and may function as a ground. Accordingly, the ground pattern 230 may perform functions such as electromagnetic interference (EMI) shielding. On the other hand, unlike the signal pattern 220, the ground pattern 230 may be connected to the dummy pattern 210.

The protective layer 400 is disposed on the insulating layer 110, and respectively covers the dummy pattern 210, the signal pattern 220, and the ground pattern 230, to protect the patterns from external physical and chemical damage. The protective layer 400 may have an opening 400h exposing at least a portion of the signal pattern 220 externally, and the signal pattern 220 exposed through the opening 400h may be electrically connected to the externally disposed configuration of a printed circuit board or a component.

When the cable substrate 100A includes a material having relatively low flexibility, the protective layer 400 may be a solder resist layer including a photosensitive material or a photocurable resin. In this case, a thermosetting resin such as an epoxy resin, a thermoplastic resin such as polyimide, or a material in which these resins are mixed with an inorganic filler, for example, ABF, may be used, but the present disclosure is not limited thereto. The opening 400h of the protective layer 400 may be formed through a photolithography process or laser processing.

On the other hand, when the cable substrate 100A includes a soft and flexible material, the protective layer 400 may be a coverlay including a material different from the above-described solder resist. The coverlay may include a soft and flexible material, and thus, may be bent to have a shape corresponding to the bending of the cable substrate 100A.

On the other hand, the protective layer 400 is not an essential component of the present disclosure, and may be omitted in some cases.

The slit portion S may be formed after the protective layer 400 of the cable substrate 100A is disposed, and in the case in which the protective layer 400 is omitted, the slit portion S may be formed after patterning the dummy pattern 210, the signal pattern 220 and/or the ground pattern 230. As a method of processing the slit portion S, one of router processing, mold processing, and laser processing may be used, and in case of using laser processing, a CO2 laser or YAG laser processing method may be used.

The slit portion S extends in one direction from one end of the substrate toward the other end of the substrate, and may be processed to have a shape penetrating through the insulating layer 110 and the protective layer 400 of the substrate in the stacking direction or the thickness direction. In addition, the slit portion S may be formed near a central portion of the cable substrate 100A in the width direction of the cable substrate 100A, and may extend in one direction described above, and in this case, the one direction may be defined as the length direction of the cable substrate 100A. In this case, in detail, a laser processing method may be used, and precision may be problematic during laser processing. Accordingly, in the laser processing for forming the slit portion S, the dummy pattern 210 described above may function as a stopper layer. While the slit portion S is formed in one direction through laser processing, since laser processing is not performed in an area in which the dummy pattern 210 is disposed, the dummy pattern 210 may be used as a stopper layer. Accordingly, a partial region of the protective layer 400 on the dummy pattern 210 may be partially removed under the influence of laser processing.

As the slit portion S is formed only up to the area in which the dummy pattern 210 is disposed as described above, the cable substrate 100A according to an example of the present disclosure may have a structure, in which the first and second connection portions 101 and 102 separated from each other are formed on one side of the cable substrate, based on the dummy pattern 210, and the side opposite thereto is integrally connected.

In addition, in the structure in which the slit portion S and the first and second connection portions 101 and 102 are formed, when the insulating layer 110 includes a soft and flexible material, the entire cable substrate 100A may have flexibility. In this case, the first and second connection portions 101 and 102 may be bent in different directions, respectively, and as a result, in the case in which an impact is applied to the area in which the first and second connection portions 101 and 102 are separated, defects such as tearing or cracking of the insulating layer 110 or the protective layer may occur. In this case, according to an example of the present disclosure, the dummy pattern 210 may be disposed in the region in which the first and second connection portions 101 and 102 are separated, and the dummy pattern 210 may function as a pattern of preventing the above-described tearing or cracking.

In addition, by forming the slit portion S in the cable substrate 100A through laser processing, a precise and relatively narrower gap between the first and second connection portions 101 and 102 may be formed. Accordingly, by increasing the number of cable substrates 100A per unit area in one strip substrate in the manufacturing process of collectively manufacturing the cable substrates 100A on the strip substrate, there is an advantage to reduce the manufacturing cost per unit area and to be able to manufacture required various layer configurations.

Although not illustrated, an electrical connection metal for connection with an external component may be disposed in the opening 400h of the cable substrate 100A. The electrical connection metal may be respectively, electrically connected to the exposed signal patterns 220. The electrical connection metal may physically and/or electrically connect the cable substrate 100A externally. For example, the cable substrate 100A may be mounted on a main board or other board of an electronic device through the electrical connection metal, or may also electrically connect other two components. The electrical connection metal may be formed of tin (Sn) or an alloy containing tin (Sn), such as solder or the like, but the material is not limited thereto. The electrical connection metal may be a land, a ball, a pin or the like.

Figure 6:
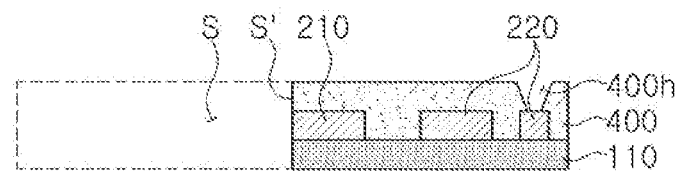
FIG. 6 is a schematic cross-sectional view of the cable substrate of FIG. 3 taken along line I-I'.

FIG. 6 is a schematic cross-sectional view of the cable substrate of FIG. 3, taken along line I-I'.

Referring to FIG. 6, the dummy pattern 210 and the signal pattern 220 may be disposed on the insulating layer 110, and the ground pattern 230 may be additionally disposed. In addition, the slit portion S may have the end portion S' in the extension direction of the slit portion, and at least a portion of the side surface of the dummy pattern 210 may be exposed to the inside of the slit portion S while being coplanar with the end portion S' as illustrated in FIG. 6. In this manner, the dummy pattern 210 is disposed to be in contact with the end portion S' of the slit portion S, and thus, may perform a function of preventing defects such as tearing or cracking during bending of the cable substrate 100A.

In the case of FIG. 6, the protective layer 400 is disposed on the insulating layer 110 to cover the dummy pattern 210 and the signal pattern 220, and the protective layer 400 may also be omitted. In the case in which the protective layer 400 is disposed as illustrated in FIG. 6, as described above, the opening 400h may be present in the protective layer 400, exposing at least a portion of the signal pattern 220 externally, and the signal pattern 220 may be connected to other components.

Figure 7:
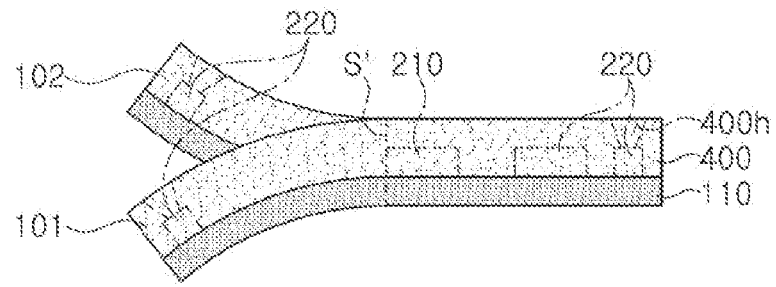
FIG. 7 is a schematic side perspective view of the cable substrate of FIG. 3.

FIG. 7 is a schematic side perspective view of the cable substrate of FIG. 3.

FIG. 7 illustrates a characteristic in which the first and second connection portions 101 and 102 may be bent in different directions when the cable substrate 100A includes a soft and flexible material. In this manner, when the cable substrate 100A may be bent in various directions, including a flexible material, the cable substrate may be connected to external configurations disposed in various positions accordingly, thereby improving design freedom. In addition, in the case of the present disclosure, the first and second connection portions 101 and 102 have a shape having respective branches, and may thus be connected to three or more external components disposed in different positions.

As illustrated in FIG. 7, the first connection portion 101 may be bent downwardly and the second connection portion 102 may be bent upwardly, and accordingly, may be freely connected to various external components disposed on the upper/lower parts. On the other hand, in this case, in the region in which the first and second connection portions 101 and 102 are separated, the possibility of occurrence of a tear defect of the cable substrate 100A increases, and to prevent such a defect, the dummy pattern 210 may be disposed in the region in which the first and second connection portions 101 and 102 are separated.

In the case of the present disclosure, a structure having first and second connection portions 101 and 102 and a slit portion S disposed therebetween is illustrated as an example. However, the number of connection portions and slit portions is not limited thereto, and a larger number of connection portions and slit portions may be included according to necessity or design. For example, a structure in which a third connection portion is additionally formed and two slit portions S are formed may also be included according to an example of the present disclosure, and multiple connections may be possible, including a greater number of connection portions and slit portions.

Figure 8:
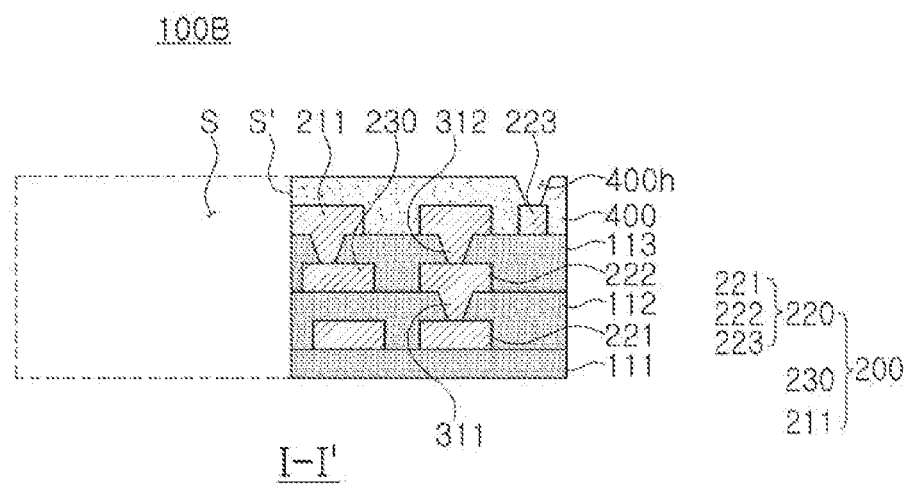
FIG. 8 is a schematic cross-sectional view taken along line I-I' in a cable substrate according to another example.

FIG. 8 is a schematic cross-sectional view taken along line I-I' in a cable substrate according to another example.

In the case of a cable substrate 100B according to another example, the stacked structure of the insulating layer and the circuit pattern may be different from that of the cable substrate 100A according to the above-described example. Therefore, in the description of the cable substrate 100B according to another example below, the difference from that of the cable substrate 100A according to the above-described example is mainly described, and for the same configuration as the cable substrate 100A according to the example described above, the same description as the cable substrate 100A according to the example may be applied thereto.

In the case of the cable substrate 100B according to an example of the present disclosure, an insulating layer may include a plurality of insulating layers 111, 112 and 113, and a signal pattern 220 may also include plurality of the signal patterns 221, 222 and 223. In addition, the cable substrate 100B according to an example may include a ground pattern 230, a dummy pattern 211 connected to the ground pattern 230, and a plurality of via layers 311 and 312 connecting between the ground pattern 230 and a dummy pattern 211 or connecting between the plurality of the signal patterns 211, 222, 223 to each other.

The plurality of insulating layers may include first to third insulating layers 111, 112, and 113, and the plurality of signal patterns may include first to third signal patterns 221, 222 and 223. The plurality of via layers may include first and second via layers 311 and 312. In addition, although the ground pattern 230 of a single layer is illustrated in the structure of FIG. 8, the ground pattern 230 may also be disposed in multiple layers on the first to third insulating layers 111, 112, and 113, and the dummy pattern 211 of a single layer may also be disposed in multiple layers.

The dummy pattern 211 prevents tearing or cracking defects of the cable substrate 100B and functions as a stopper during laser processing, and may be formed on the third insulating layer 113, which is an insulating layer disposed as an outermost layer. In addition, the dummy pattern 211 may be connected to the first ground pattern 230 disposed in the inner layer through the second via layer 312, but may not be connected to the third signal pattern 223 disposed on the same layer as the dummy pattern 211.

In the case of the cable substrate 100B according to an example, a protective layer 400 may be disposed on the third insulating layer 113 that is an outermost insulating layer, and the protective layer 400 may cover the third signal pattern 223 disposed on the third insulating layer 113, and at least a portion of the third signal pattern 223 may be exposed externally through an opening 400h of the protective layer 400.

Figure 9:
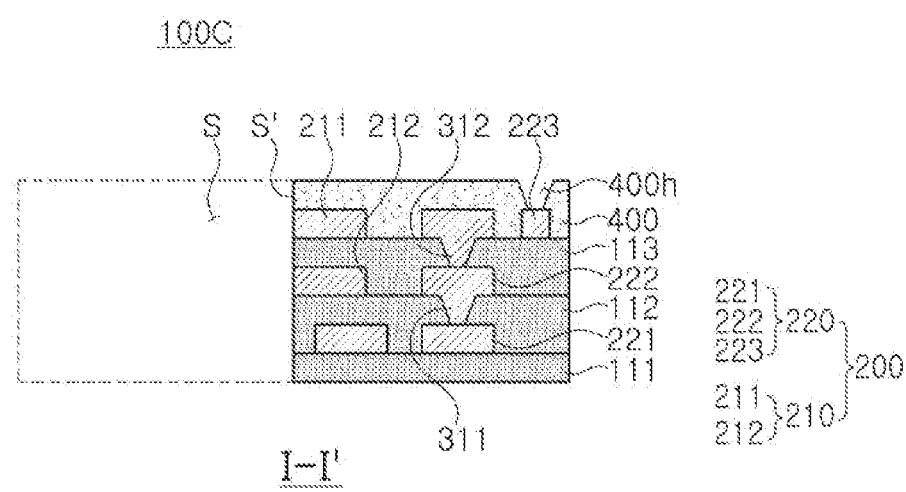
FIG. 9 is a schematic cross-sectional view taken along line I-I' in a cable substrate according to another example.

FIG. 9 is a schematic cross-sectional view taken along line I-I' in a cable substrate according to another example.

In the case of a cable substrate 100C according to another example, the stacked structure of a dummy pattern may be different from that of the cable substrate 100B according to the example. Therefore, in the description of the cable substrate 100C according to another example below, the differences compared to the cable substrate 100B according to the example described above are mainly described, and for the same configuration as the cable substrate 100B according to the example, the same description as the cable substrate 100B according to the foregoing example may be applied thereto.

In the cable substrate 100C according to the example of FIG. 9, a dummy pattern may be disposed in a plurality of layers to include first and second dummy patterns 211 and 212. The first and second dummy patterns 211 and 212 are not connected to the signal patterns 223 and 222 which are disposed on the same layers, respectively, but may be spaced apart therefrom at a predetermined distance, respectively.

On the other hand, the first and second dummy patterns 211 and 212 may contact the ground pattern disposed on the same layers, respectively.

At least a portion of side surfaces of each of the first and second dummy patterns 211 and 212 may be exposed to the inside of a slit portion S similarly to the aforementioned cable substrates 100A and 100B, and the side surface thereof may be coplanar with the inner wall of the slit portion.

Other contents are substantially the same as described above, and overlapping contents will be omitted.

As set forth above, according to examples, a cable substrate capable of multiple connections may be provided.

In addition, a cable substrate in which damage to the substrate in a separation area may be prevented may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A cable substrate comprising:
an insulating layer;
a slit portion penetrating through at least a portion of the insulating layer in a thickness direction of the insulating layer; and
a dummy pattern disposed on the insulating layer,
wherein the insulating layer extends across first to fourth portions of the cable substrate,
the first portion and the second portion each extend from one side of the third portion and are separated from each other by the slit portion,
the fourth portion extends from another side of the third portion,
the dummy pattern is disposed in the third portion, and
at least a portion of the dummy pattern is exposed to the slit portion.

2. The cable substrate of claim 1, wherein the slit portion extends in a direction from one end of the insulating layer to the other end of the insulating layer.

3. The cable substrate of claim 1, wherein the dummy pattern is disposed on a region of the insulating layer in contact with an end portion of the slit portion in a direction in which the slit portion extends.

4. The cable substrate of claim 1, wherein at least a portion of a side surface of the dummy pattern is coplanar with at least a portion of an inner wall of the slit portion.

5. The cable substrate of claim 1, wherein the insulating layer includes first and second connection portions which are provided with the slit portion interposed therebetween.

6. The cable substrate of claim 1, wherein the insulating layer comprises at least one of polyimide and Liquid Crystal Polymer (LCP).

7. The cable substrate of claim 1, further comprising:
a signal pattern disposed on the insulating layer; and
a ground pattern disposed on the insulating layer.

8. The cable substrate of claim 7, wherein the dummy pattern is disposed to be spaced apart from the signal pattern and is connected to at least a portion of the ground pattern.

9. The cable substrate of claim 7, further comprising a protective layer disposed on the insulating layer and having an opening exposing at least a portion of the signal pattern.

10. A cable substrate comprising:
a plurality of insulating layers;
a slit portion penetrating through the plurality of insulating layers and extending in one direction; and
a dummy pattern disposed on at least one of the plurality of insulating layers and at least partially exposed to an inner wall of the slit portion,
wherein the plurality of insulating layers extend across first to fourth portions of the cable substrate,
the first portion and the second portion each extend from one side of the third portion and are separated from each other by the slit portion,
the fourth portion extends from another side of the third portion, and
the dummy pattern is disposed in the third portion.

11. The cable substrate of claim 10, wherein the dummy pattern is disposed on an outermost layer of the plurality of insulating layers.

12. The cable substrate of claim 10, wherein the plurality of insulating layers include at least one of polyimide and Liquid Crystal Polymer (LCP).

13. The cable substrate of claim 10, wherein the dummy pattern is disposed to surround at least a portion of an end portion of the slit portion.

14. The cable substrate of claim 10, further comprising a plurality of signal patterns and a plurality of ground patterns disposed on or between the plurality of insulating layers.

15. The cable substrate of claim 14, wherein in the dummy pattern, a pattern disposed on the same layer as the signal pattern is spaced apart from the signal pattern, and in the dummy pattern, a pattern disposed on the same layer as the ground pattern is connected to the ground pattern.

16. The cable substrate of claim 14, further comprising:
a via layer connecting the plurality of signal patterns; and
a protective layer disposed on the plurality of insulating layers and having an opening exposing at least a portion of one of the plurality of signal patterns.

17. A cable substrate comprising:
one or more insulating layers; and
one or more conductive layers disposed on the one or more insulating layers, and including first to fourth patterns respectively disposed in first to fourth portions of the cable substrate,
wherein the one or more insulating layers extends across the first to fourth portions of the cable substrate,
the first portion and the second portion each extend from one side of the third portion and are separated from each other by a slit portion of the cable substrate,
the fourth portion extends from another side of the third portion, and
the third pattern in the third portion is exposed to the slit portion.

18. The cable substrate of claim 17, wherein at least a portion of a side surface of the third pattern is coplanar with at least a portion of an inner wall of the slit portion.

19. The cable substrate of claim 17, wherein the one or more insulating layers comprise one of polyimide or Liquid Crystal Polymer (LCP).

20. The cable substrate of claim 17, wherein the first pattern is connected to a portion of the fourth pattern, and the second pattern is connected to another portion of the fourth pattern.

21. The cable substrate of claim 17, wherein the third pattern is connected to a ground pattern of the cable substrate.

22. The cable substrate of claim 17, further comprising a protective layer disposed on the one or more insulating layer and having an opening exposing a portion of the one or more conductive layers.

* * * * *